United States Patent
Bougrov et al.

(10) Patent No.: US 8,062,913 B2
(45) Date of Patent: Nov. 22, 2011

(54) SEMICONDUCTOR STRUCTURE AND METHOD OF MANUFACTURING A SEMICONDUCTOR STRUCTURE

(75) Inventors: Vladislav E. Bougrov, Espoo (FI); Maxim A. Odnoblyudov, Espoo (FI)

(73) Assignee: OptoGaN, Oy, Espoo (FI)

( * ) Notice: Subject to any disclaimer, the term of this patent is extended or adjusted under 35 U.S.C. 154(b) by 0 days.

(21) Appl. No.: 12/829,466

(22) Filed: Jul. 2, 2010

(65) Prior Publication Data
US 2010/0314662 A1 Dec. 16, 2010

(51) Int. Cl.
H01L 21/00 (2006.01)

(52) U.S. Cl. ............ 438/22; 438/23; 438/27; 257/14; 257/98

(58) Field of Classification Search .......... 438/22, 438/25, 26, 27, 29, 477, 565, 936; 257/14, 257/98, E21.097, E21.09, E29.024
See application file for complete search history.

(56) References Cited

U.S. PATENT DOCUMENTS

| | | | |
|---|---|---|---|
| 3,954,534 A | | 5/1976 | Scifres et al. |
| 5,491,350 A | * | 2/1996 | Unno et al. ............ 257/99 |
| 5,779,924 A | | 7/1998 | Krames et al. |
| 5,793,062 A | | 8/1998 | Kish, Jr. et al. |
| 6,316,785 B1 | * | 11/2001 | Nunoue et al. .......... 257/14 |
| 6,781,160 B1 | | 8/2004 | Tsai et al. |
| 6,821,804 B2 | | 11/2004 | Thibeault et al. |
| 6,903,376 B2 | | 6/2005 | Shen et al. |
| 2003/0089917 A1 | | 5/2003 | Krames et al. |
| 2003/0218172 A1 | | 11/2003 | Sugawara et al. |
| 2005/0001227 A1 | | 1/2005 | Niki et al. |
| 2005/0023549 A1 | | 2/2005 | Gardner et al. |
| 2005/0082546 A1 | | 4/2005 | Lee et al. |

OTHER PUBLICATIONS

Search report from Finnish Patent Application FI20050707.
Search report from PCT/FI2006/000220.

* cited by examiner

*Primary Examiner* — Thinh T Nguyen
(74) *Attorney, Agent, or Firm* — Fay Sharpe LLP

(57) ABSTRACT

A semiconductor structure is formed of nitrides of group III metals having wurtzite crystal structure and grown in vapor phase on a (0001) oriented semiconductor substrate. The structure comprises a bottom cladding layer, a top cladding layer, and a diffusion region positioned between the cladding layers for diffusing light propagating within the semiconductor structure. The diffuse region has refractive index different from those of the cladding layers and non-flat surfaces for providing light diffusing interfaces between the diffusion region and the cladding layers. According to the invention, the diffusion region comprises a plurality of diffusion layers, compositions and thicknesses of said diffusion layers having been chosen to avoid formation of strain-induced dislocations in the diffusion region, and adjacent diffusion layers having different refractive indices in order to further enhance the diffusion efficiency.

8 Claims, 3 Drawing Sheets

Figure 2 (prior art)
(a)
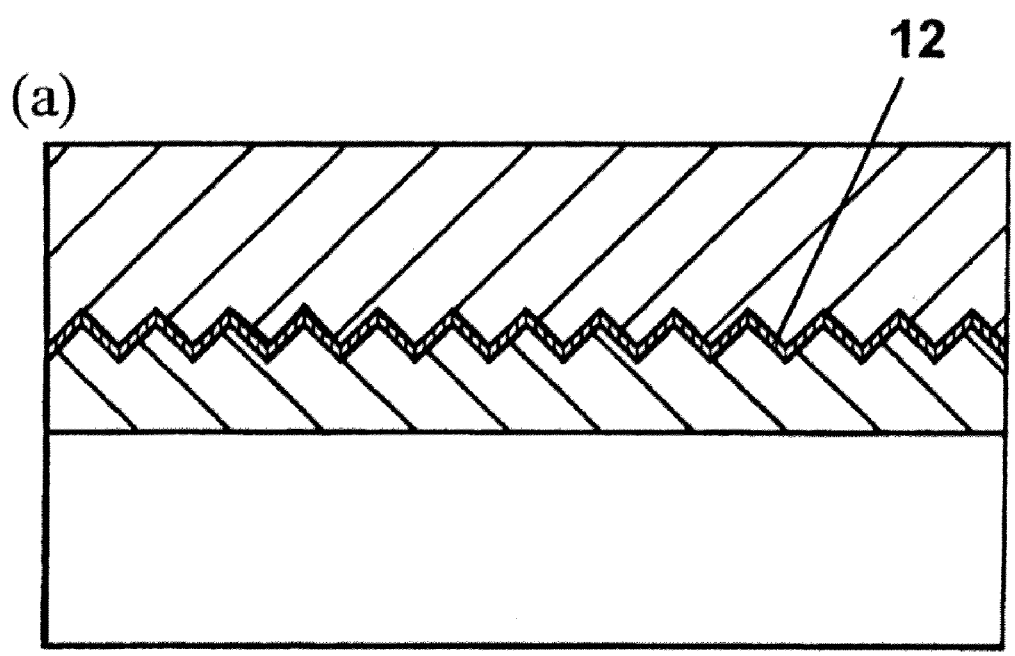
(b)
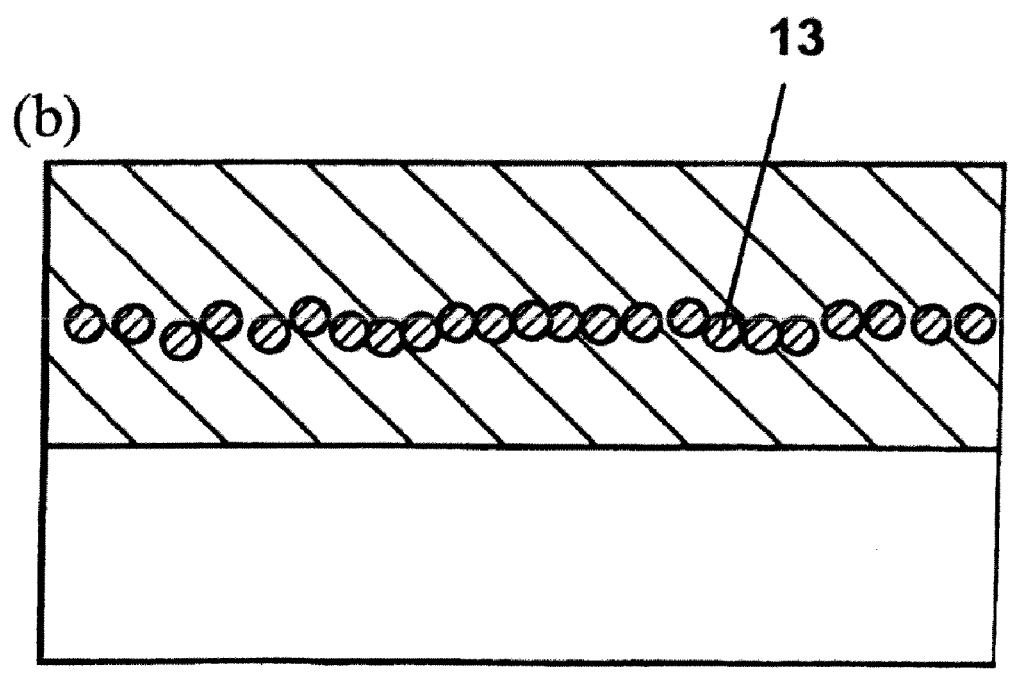

SEMICONDUCTOR STRUCTURE AND METHOD OF MANUFACTURING A SEMICONDUCTOR STRUCTURE

This application claims the priority benefit of U.S. Application Ser. No. 11/988,055, filed Apr. 28, 2008, the disclosure of which is incorporated herein by reference.

FIELD OF THE INVENTION

The invention relates in general to a semiconductor structure with enhanced light diffusion capability to be used as a part of a light emitting device. More particularly, the semiconductor structure is formed of nitrides of group III metals with wurtzite crystal structure and grown in vapor phase on a (0001) oriented substrate, formed either of the semiconductor structure materials or of foreign materials. The invention also relates to a method of manufacturing such structure.

BACKGROUND OF THE INVENTION

Design of a semiconductor structure for light emitting diodes influences on overall efficiency of the diodes through two main parameters: efficiency of conversion of electrical power to optical power in light generation region and efficiency of emission of light generated in this region from the structure. In a light emitting structure made of nitrides of group III metals grown in vapor phase on foreign substrate with refractive index less than that of the structure materials, a significant part of generated light propagates inside the structure due to reflection on structure/substrate and structure/ambient interfaces. Only a part of light propagating within a certain critical angle, defined by Snell's law and related to the surface normal direction, leave the structure through the structure surface. This critical angle depends on refractive indices of structure material and substrate and ambient materials. Due to a significant difference in these refractive indices between the substrate (e.g., ≈1.8 for sapphire) and the ambient (e.g., ≈1.5 for typical encapsulating resins), as compared to the structure materials (≈2.5-3), this critical angle is relatively small. Up to two thirds of light can propagate in structure layers, serving as waveguide. In light emitting diode chips, this light is potentially capable to exit via chip sides. However, because of the many loss mechanisms present in the structure layers and electrodes, most of this light is lost before exiting chip sides. Because of this, the efficiency of light emission from the structure is significantly decreased, resulting in decreased overall device efficiency.

A number of methods including ex-situ technological operations constitute a significant part of the patents devoted to the problem. One method for improving capability of light to be emitted from the structure is to shape light emitting surface into a hemisphere. This method is disclosed by Scifres and Burnham in U.S. Pat. No. 3,954,534 and includes formation of hemispherical depressions on a substrate with subsequent growth of semiconductor layers over the substrate and removing the substrate away. Another solution is disclosed by Krames and Kish Jr. in U.S. Pat. No. 5,779,924. It is suggested to increase transmission of total optical power from the structure to ambient by fabricating ordered interface texturing. This texturing reduces Fresnel reflection at the interface between the structure and ambient and increase the critical angle, propagating within which light can leave the structure through the surface. Kish Jr. and Stockman in U.S. Pat. No. 5,793,062 suggested inserting non-absorbing distributed Bragg reflectors inside the structure designed to redirect light away from absorbing regions such as contacts within the chip. In fact, it is hard to grow laterally patterned distributed Bragg reflectors in case of nitrides of group III metals. Gardner et al in U.S. Pat. No. 6,847,057 B1 disclose a light emitting device, in which improved light diffusion is provided by texturing of the substrate surface, or structure surface, or one of internal structure interfaces. The invention also suggests using an optional polarization selection layer that polarizes the photons emitted by the active region. The polarization selection layer can be wire grid polarizer and may be formed on a side of the substrate opposite the device layers. A wire grid polarizer reflects photons of a polarization that is parallel to the wires, and transmits photons of a polarization that is perpendicular to the wires. The combination of the wire grid polarizer and reflecting texturing surface should recycle photons until they achieve a certain polarization. As already mentioned, one common disadvantage of these methods is that, although they can provide effective light diffusion, they require a number of ex-situ operations resulting in complicated manufacturing process.

Several in situ methods have also been suggested. Krames et al. in U.S. Pat. No. 6,649,440 B1 disclose an in situ method of making a light emitting device with improved light extraction efficiency. The method utilizes a thick multi-layered epitaxial structure that increases the light extraction efficiency from the device. The multi-layered structure does not absorb the light, and its increased thickness allows light trapped within a waveguide to escape the light emitting device through the sides of the structure with fewer reflections, thus avoiding light losses in active region and electrodes. A disadvantage of the method is that the multi-layered structure must be much thicker than light emitting region to provide significant improvement of light extraction from the device, thus resulting in significantly higher growth time and cost of such structure, as compared to conventional structures. Besides, thick multi-layered structure can induce significant strain in the light emitting structure. Krames et al. in U.S. Pat. No. 6,683,327 B2 disclose a light emitting device including a nucleation layer containing aluminum. The thickness and aluminum composition of the nucleation layer are selected to match the index of refraction of the substrate and device layers, such that 90% of light from the device layers incident on the nucleation layer is extracted into the substrate. One disadvantage of this method is that it is hard to grow in vapor phase light emitting structures above such a nucleation layer, having thickness required to provide effective light diffusion, without deteriorating structural quality of above grown layers. Thibeault et al in U.S. Pat. No. 6,821,804 B2 disclose several solutions based on creation of arrays of light extraction elements formed either within the structure or on the substrate prior to epitaxial growth. The array of light extraction elements are formed to provide a spatially varying index of refraction, so that light trapped within a waveguide interacts with the arrays, changes direction of propagation and can escape the light emitting device. These solutions improve significantly capability of light to be emitted from the structure; however inclusions of foreign materials can introduce additional defects in structure layers. Another proposed solution is insertion of disperser layers formed either within the structure or on the substrate prior to epitaxial growth. However to provide refractive index difference large enough for effective light refraction, a layer made of nitrides of group III metals should have thickness and composition, which can introduce significant additional strains in the structure. Shen et al in U.S. Pat. No. 6,903,376 B2 disclose a light emitting device, which includes light emitting region and a reflective contact separated from the light emitting region by one or more layers. The separation between the light emitting region and the reflective contact is between $0.5\lambda_n$ and $0.9\lambda_n$ or between $\lambda_n$ and $1.4\lambda_n$, etc, where $\lambda_n$ is the wavelength of light emitted from the light emitting region in an area of the device separating the light emitting region and the reflective contact. According to the invention, light extraction efficiency of topside flux as a function of the separation distance has maximums at certain values, because of the phase shift of light reflected from the reflective contact and interference of light directly emitted from the light emitting region and reflected from the contact. In fact, however, this phenomenon is efficient for thin single quantum well regions, but less pronounced in case of complex light emitting regions having several quantum wells. One common disadvantage of all the described in situ methods is that they result in additional strains in the structure with consequent increase of defect density.

As one of the latest solutions, Lee et al in US patent application 2005/0082546 A1 disclose a method, which includes formation of a substrate having at least one protruded portion with a curved surface, in which uniform stress distribution can be obtained. The device provides improved light extraction, while saving consistent defect density in the structure. One disadvantage of this method is that, although it provides effective light diffusion, it requires complicated manufacturing process, including ex-situ operations.

PURPOSE OF THE INVENTION

The purpose of the invention is to eliminate the above-referred disadvantages of the prior art.

Specifically, the purpose of the invention is to disclose a new type of semiconductor structure with enhanced light diffusion capability without formation of additional strain-induced dislocations, resulting in highly increased brightness of light emitting devices utilizing the semiconductor structure, the semiconductor structure being formed of nitrides of group III metals having wurtzite crystal structure and grown in vapor phase on an (0001) oriented substrate formed either of the semiconductor structure materials or of foreign materials.

It is also the purpose of the invention to disclose a new, effective and well controllable entirely in situ method for manufacturing a semiconductor structure of the type described above.

SUMMARY OF THE INVENTION

The semiconductor structure in accordance with the present invention is characterized by what is presented by claim 1. The structure is formed of nitrides of group III metals having wurtzite crystal structure and grown in vapor phase on an (0001) oriented semiconductor substrate. The substrate can be formed either of materials of the semiconductor structure or of some foreign materials. The semiconductor structure comprises a bottom cladding layer and a top cladding layer with a flat upper surface grown above the bottom cladding layer, the lattice constant of the top cladding layer being the same as that of the bottom cladding layer. Different lattice constants of the cladding layers could cause formation of strain-induced dislocations in the structure. An essential part of the structure is a diffusion region positioned between the bottom cladding layer and the top cladding layer for diffusing light propagating within the semiconductor structure. The diffusion region has a refractive index different from those of the cladding layers and non-flat surfaces in order to form light diffusing interfaces between the diffusion region and the cladding layers. Non-flat surfaces provide diffusing interfaces of different directions. These kind of surfaces make the light rays emitted by light emitting device layers grown above the structure randomly change their propagation directions, thus improving their probability to have a direction in which escaping from the device is possible. As result, brightness of the light emitting device is improved. The non-flat upper surface of the diffusion region is transformed to a flat surface during growth of the top cladding layer. Such a flat surface is well suitable for further epitaxial growing of light emitting device layers on it. As used in this document, the term "layer" generally refers to a single crystal epitaxial layer. The term "diffusion" refers to all kind of mechanisms changing the direction of propagation of light at the interfaces, including reflection, scattering and refraction.

According to the present invention, said diffusion region comprises a plurality of diffusion layers, compositions and thicknesses of the diffusion layers having been chosen to avoid formation of strain-induced dislocations in the diffusion region. Preferably, each of the diffuse layers has non-flat surfaces in order to maximize the diffusion efficiency. Avoiding formation of dislocations is very important because dislocations could cause degradation of the properties of light emitting device layers later grown on the semiconductor structure. Avoiding dislocations can be realized by providing effective strain relaxation within the structure. In addition, in accordance of the present invention, the refractive index of adjacent diffusion layers are different in order to further enhance the diffusion efficiency via increased number of diffusing layer interfaces. The total thickness of the diffusion region is chosen to provide effective light diffusion. The bigger is the difference in refractive indices of the diffusion and cladding layers, the smaller is the required total diffusion region thickness. The structure of the present invention provides enhanced light diffusing capability resulting in highly increased brightness of a light emitting device grown on top of the structure without introducing additional dislocations in the layers. This is a great development step compared to the prior art substrates with light diffusion provided by insertion of a single diffusing layer.

The basic idea of the invention is applicable to different materials. In one embodiment said nitrides of group III metals are of the form $Al_xGa_{1-x-y}In_yN$, wherein $0 \leq x \leq 1$, $0 \leq y \leq 1$.

In one preferred embodiment said bottom and top cladding layers are of the same material. In this case, the diffusion layers are preferably lattice matched to the cladding layers. Thus insertion of the diffusion region does not lead to generation of elastic misfit stresses in the layers, and no misfit dislocations are formed at the layer interfaces. Another alternative is that the diffusion layers are lattice mismatched to the bottom and the top cladding layers and thickness of each individual diffusion layer is smaller than the Matthews-Blakeslee critical thickness, which is the maximum thickness for a dislocation-free layer. Theory behind the Matthews-Blakeslee critical thickness will be explained later in this document. In addition, in this embodiment one of two adjacent diffusion layers has a positive and the other a negative lattice misfit to the cladding layers in order to avoid strain accumulation in the diffusion region. This feature together with said thickness limitation below the Matthews-Blakeslee critical thickness makes it possible to have a diffusion region with a sufficient thickness without additional strain-induced dislocations. For example, a stack consisting of pairs of first and second diffusion layers with equal thicknesses and having opposite lattice misfits of the same amplitude has a zero total strain.

In one special, preferred embodiment the bottom cladding layer and the diffuse layers have upper surfaces with facets having crystallographic indices other than (0001) and those of the type {1T00}. Thus the diffusion region reproduces the facets on the upper surface of the bottom cladding layer. This kind of structure having specific inclined facets results in effective light diffusion.

The method of the present invention of manufacturing a semiconductor structure is characterized by what is presented in claim 7. The structure is formed of nitrides of group III metals having wurtzite crystal structure and grown in vapor phase on a (0001) oriented semiconductor substrate, which can be formed either of the semiconductor structure materials or of foreign materials. After placing the substrate into a reactor, the method first comprises a step of growing in vapor phase a bottom cladding layer. After this there is a step of growing in vapor phase a diffusion region above the bottom cladding layer for diffusing light propagating within the semiconductor structure, the diffusion region having a refractive index different from that of the bottom cladding layer and non-flat surfaces. The method finally comprises a step of growing in vapor phase a top cladding layer above the diffusion region, the top cladding layer having a flat upper surface, refractive index different from that of the diffusion region, and a lattice constant the same as that of the bottom cladding layer. The vapor-phase growth processes can be executed with a vapor phase epitaxy reactor based for example on metal organic vapor-phase epitaxy or hydride vapor-phase epitaxy.

According to the present invention, the growing of the diffusion region comprises steps of growing a plurality of diffusion layers, compositions and thicknesses of the diffusion layers having been chosen to avoid formation of strain-induced dislocations in the layer interfaces, and adjacent diffusion layers having different refractive indices in order to further enhance the diffusion efficiency. Thus, the method of the present invention, in contrast to the methods disclosed in prior art utilizing insertion of a single diffusing layer, targets efficient light diffusion in the structure without introducing additional dislocations in the layers.

Preferably, said nitrides of group III metals are of the form $Al_xGa_{1-x-y}In_yN$, wherein $0 \leq x \leq 1$, $0 \leq y \leq 1$.

In one preferred embodiment bottom and top cladding layers are of the same material. In this case it is preferable to grow diffuse layers having lattice constants the same as that of the cladding layers. Then no strain is generated in the layer interfaces and thus no strain-induced dislocations are developed. It is also possible to grow diffusion layers having lattice constants different from that of the cladding layers, each of them having a thickness smaller than the Matthews-Blakeslee critical thickness, and one of two adjacent diffusion layers having a lattice constant greater and the other a lattice constant smaller than that of the cladding layers. In this case strain is generated in the layers due to the lattice mismatch. However, dislocations are avoided by choosing the layer thicknesses being below said Matthews-Blakeslee critical thickness and choosing adjacent diffusion layers having opposite lattice misfits to the cladding layers in order to avoid accumulation of strain. The Matthews-Blakeslee critical thickness, which is the maximum thickness for a dislocation-free layer, is discussed in more detail later in this document.

In one special, preferred embodiment bottom cladding layer and diffuse layers are grown which have upper surfaces with facets having crystallographic indices other than (0001) and those of the type {1T00}. Thus the diffusion region reproduces the facets on the upper surface of the bottom cladding layer. This kind of structure having specific inclined facets results in effective light diffusion. Growth of the facets of the bottom cladding layer and the diffuse region can be achieved by utilizing preferential growing of these facets. As is known for those skilled in the art, it is possible to choose the process parameters such as e.g. time, gas flows, temperature and pressure to produce growth of facets with these crystallographic indexes. However, each reactor has its own individualistic parameters so that no generic set of parameter values can be given. Respectively, the top cladding layer with a flat upper surface can be produced by preferential growing of plane facets with crystallographic index (0001).

The growing of the bottom cladding layer having said facets on its upper surface comprises preferably a step of formation of precipitates (14) on a (0001) oriented surface, said precipitates having a height of 0.1-1.5 μm and surface density of $10^7$-$10^8$ cm$^{-2}$. Formation of precipitates is a usual phenomenon during the initial stages of growing a layer of nitrides of group III metals on an (0001) oriented surface. The precipitates usually have a pyramidal shape having said facets. By producing precipitates having said particular properties it is assured that sufficient large facets suitable for further preferential growing of the diffusion layers are provided. In general, the precipitates are formed during low-temperature deposition of the material with subsequent recrystallization at higher temperature. However, such technique typically results in forming a number of small precipitates with high density tending to merge before reaching the required height. According to the present invention, preferably, but not exclusively, the precipitates are formed during a sequence of short low-temperature depositions, performed in temperature range of 450-700° C., followed by high-temperature layer annealing periods, performed in temperature range of 900-1150° C. Accurate temperatures depend on the materials and reactor type used. Duration of said short low-temperature depositions can be e.g. some dozens of seconds. During each annealing a part of deposited material is removed from the surface. Process parameters during annealing, such as temperature gradient and annealing time, are chosen to totally remove small precipitates while save large ones. In result, the dominant growth of only the largest precipitates occurs. The precipitates can be grown directly on the (0001) oriented semiconductor substrate. It is also possible to first grow a part of the bottom layer having a (0001) surface and grow the precipitates on that surface.

The whole method of the present invention can be executed by in situ process steps in contrast to many of the prior art methods involving unwanted and complicated ex situ phases.

An important feature of the invention described above is that insertion of thick enough diffusion region does not introduce additional dislocations in the layers. In general the insertion of lattice mismatched layers leads to substantial crystal lattice mismatch between the layers resulting in the generation of elastic misfit stresses (tension or compression) in the layers. These stresses can relax via formation of misfit dislocations at the interfaces. In the majority of cases the misfit dislocations are associated with threading dislocations, which are concomitant to misfit dislocations but have their lines going through the film to the free surface. The threading dislocations are harmful for device performance. The optimal solution is to provide effective light diffusion without introducing additional dislocations in the layers. It is known to those skilled in the art that generation of dislocations does not occur, in case thickness of the lattice mismatched layers is less than the Matthews-Blakeslee critical thickness $h_c$ for misfit dislocation generation. The critical thickness may be derived by considering the energetic of a combined threading/misfit dislocation configuration in a stressed film and can be approximately assumed as $h_c \approx b/\epsilon_m$, where b is the magnitude of the dislocation Burgers vector and $\epsilon_m$ is the misfit parameter. For nitrides of group III metals having wurtzite crystal structure, the possible Burgers vectors include the $\pm c$ and $\pm a_i$ ($i=1, 2, 3$) lattice translation vectors and their sums $\pm c \pm a_i$. The c-translation is larger than the a-translation, giving the expression for the critical thickness $h_c \approx a/\epsilon_m = a^2/\Delta a$, where a is the in-plane lattice constant, $\Delta a$ is the difference of in-plane lattice constants of the layers.

As a summary, several advantages in comparison to the prior art can be achieved with the present invention. A structure with effective light diffusion capability can be realized with a reasonable low diffusion region thickness and without causing harmful dislocations. The manufacturing process comprises in situ process steps only which makes the process very convenient and allows high production rate.

BRIEF DESCRIPTION OF THE DRAWINGS

The accompanying figures, which are included to provide a further understanding of the invention and constitute a part of this specification, illustrate embodiments of the invention as well as prior art examples and together with the description help to explain the principles of the invention.

FIG. 2 represents schematic cross sectional of substrates grown by prior art methods.

DETAILED DESCRIPTION OF THE INVENTION

Reference will now be made in detail to the embodiments and examples relating to the present invention, which are illustrated in the accompanying figures.

Figure 1:
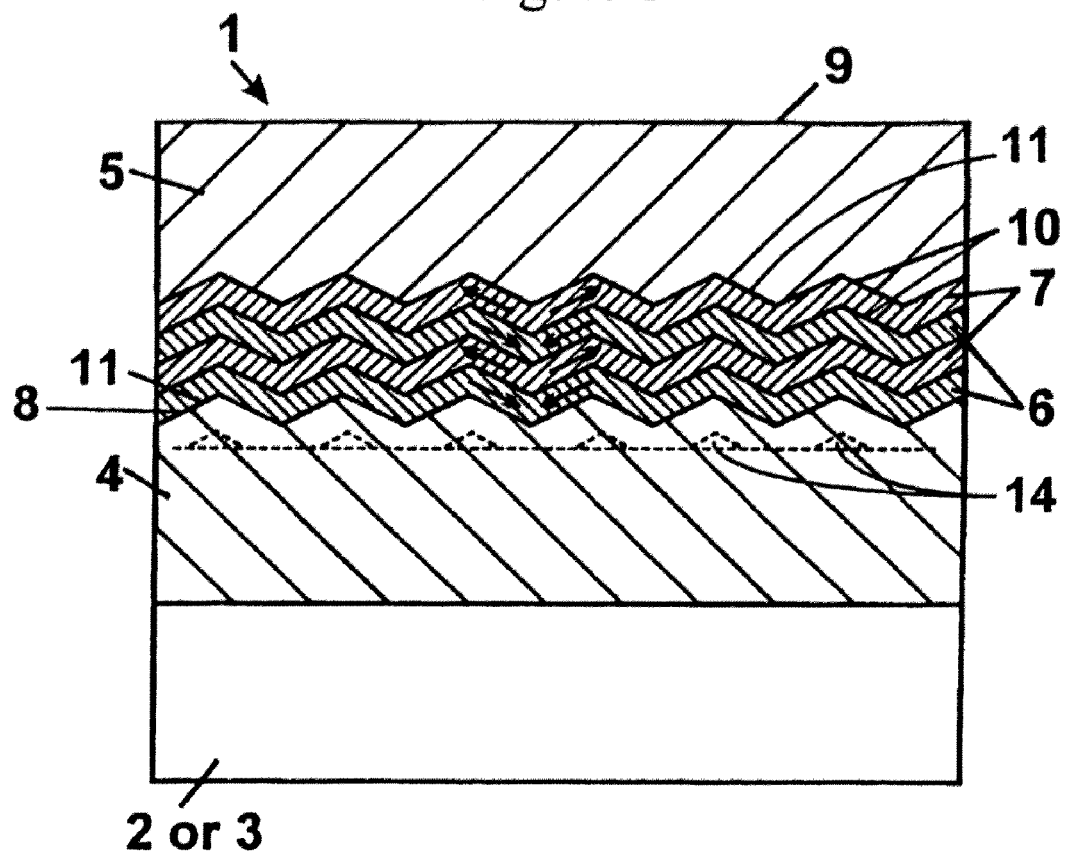
FIG. 1 shows a schematic cross sectional view of a semiconductor structure according to the present invention.

The semiconductor structure 1 of FIG. 1 comprises a substrate 2 formed of the semiconductor structure materials or substrate 3 formed of foreign materials, a bottom cladding layer 4 with a surface 8 having facets 11 with crystallographic indexes other than (0001) and those of the type {1$\bar{1}$00}, a top cladding layer 5 with flat surface 9, and a diffusion region consisting of two pairs of first diffusion layer 6 and second diffusion layer 7. Dashed line shows the precipitates 14 grown during the growing of the bottom cladding layer. The top cladding layer has a lattice constant equal to that of the bottom cladding layer. The diffusion layers have refractive indices different from those of the cladding layers. In addition, the refractive index of the first diffusion layers 6 is different from that of the second diffusion layers 7. The first diffusion layers 6 can have different indices of refraction. This can be the case also with the second diffusion layers 7. The diffusion layers 6 and 7 are not flat, but they reproduce the facets 11 on the surface of the bottom cladding layer. Compositions and thicknesses of the diffusion layers 6 and 7 have been chosen to provide effective strain relaxation inside the structure 1 without formation of misfit dislocations at the layer interfaces. More accurately, each of the diffusion layers has a thickness smaller than the Matthews-Blakeslee critical thickness. Moreover, the first and the second diffusion layers of equal thicknesses have opposite lattice misfits of the same amplitude to the cladding layers. Direction of the strain in each layer is illustrated by arrows. Opposite strains compensate each other, thereby preventing accumulation of strain. The total thickness of the diffusion region has been chosen to provide effective light diffusion. The bigger is the difference in refractive indices of the diffusion and cladding layers, the smaller is the required total diffusion region thickness. The semiconductor structure 1 provides enhanced light diffusion capability without introducing additional dislocations in the layers. In addition, the top cladding layer Surface 9 forming the semiconductor structure surface is of high crystalline quality and as such well suitable for further growing of the device layers.

Prior art in situ solutions illustrated in FIG. 2 provide light diffusion either by growing of an intermediate single crystal epitaxial semiconductor layer 12 with index of refraction and lattice constant being different from those in the bottom and the top layers (FIG. 2a) or by insertion of inclusions of amorphous material 13 (FIG. 2b). As is seen in FIG. 2a, the thickness of a single layer should be thin in order to avoid formation of strain-induced dislocations. This leads to inefficient diffusion. The structure of FIG. 2b, though improving light diffusion in the structure, results in generation of elastic misfit stresses in the layers and formation of misfit dislocations at the interfaces. Other prior art methods necessitate ex situ process steps, which complicate the manufacturing process.

Figure 3:
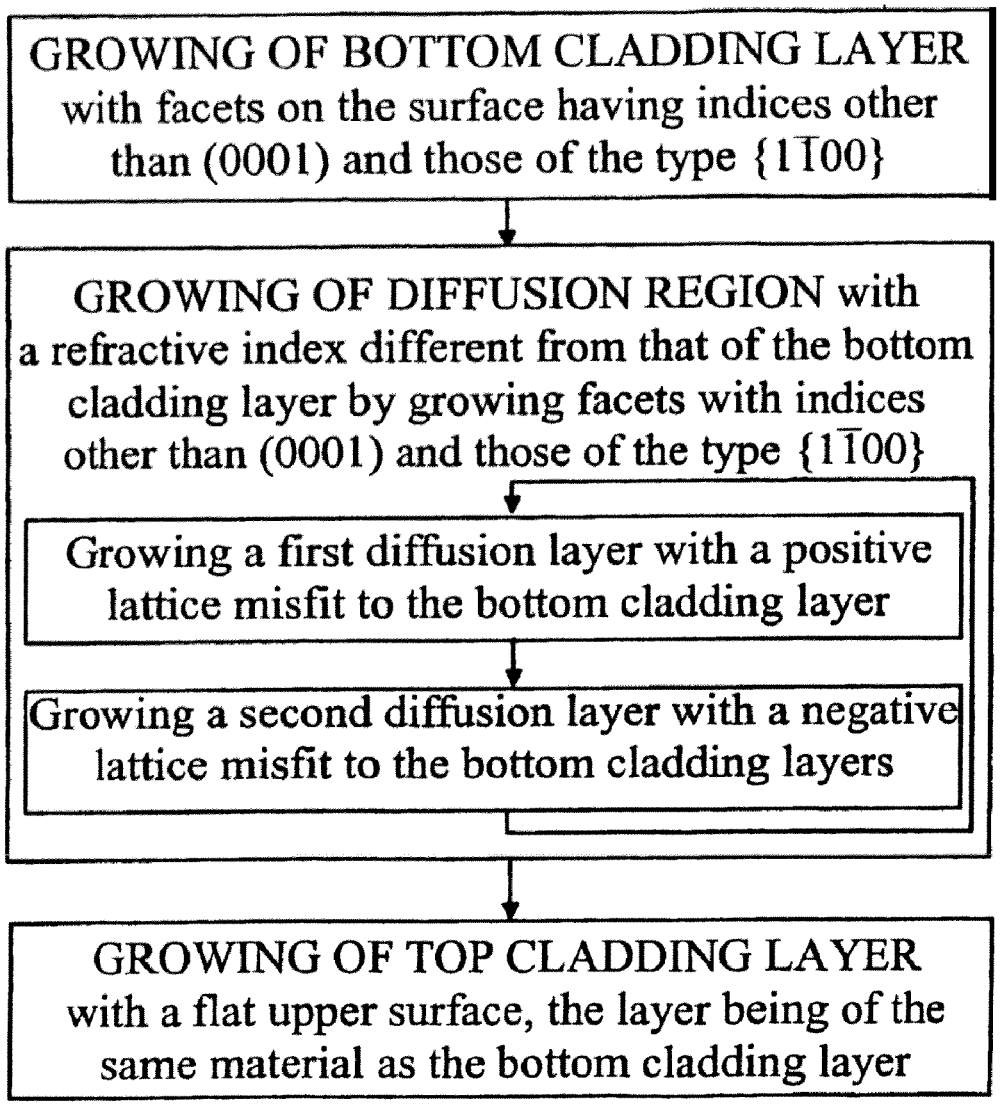
FIG. 3 shows one embodiment of the method of the present invention as a flow chart.

The manufacturing method according to one of the embodiments of the present invention illustrated in FIG. 3 has three main steps. At first, a bottom cladding layer is grown. The second step is growing a plurality of at least two pairs of first and second diffusion layers with facets on the surfaces, characterized by crystallographic indexes other than (0001) and those of the type {1$\bar{1}$00}, the refractive index of the first diffusion layers being different from that of the second diffusion layers. First diffusion layers have a positive lattice misfit to the cladding layers, while the second diffusion layers have a negative lattice misfit, preferably of the same amplitude. Thickness of each individual diffusion layer is preferably smaller than the Matthews-Blakeslee critical thickness $h_c$ for avoiding misfit dislocation generation. The third step is growing a top cladding layer with flat surface, the layer being of the same material as the bottom cladding layer. The method provides growth of a semiconductor structure with efficient light diffusion without introducing additional dislocations in the layers.

It is obvious to a person skilled in the art that with the advancement of technology, the basic idea of the invention may be implemented in various ways. The invention and its embodiments are thus not limited to the examples described above; instead they may vary within the scope of the claims.

The invention claimed is:

1. A method of manufacturing a semiconductor structure (1) formed of nitrides of group III metals having wurtzite crystal structure and grown in vapor phase on a (0001) oriented semiconductor substrate (2,3), the method comprising steps of growing in vapor phase a bottom cladding layer (4);

growing in vapor phase a diffusion region (6,7) above the bottom cladding layer for diffusing light propagating within the semiconductor structure (1), the diffusion region having a refractive index different from that of the bottom cladding layer and non-flat surfaces; and growing in vapor phase a top cladding layer (5) above the diffusion region, the top cladding layer having a flat upper surface (9), a refractive index different from that of the diffusion region, and a lattice constant the same as that of the bottom cladding layer, characterized in that the growing of the diffusion region comprises steps of growing a plurality of diffusion layers (6,7), compositions and thicknesses of the diffusion layers having been chosen to avoid formation of strain-induced dislocations in the layer interfaces, and adjacent diffusion layers (6,7) having different refractive indices in order to further enhance the diffusion efficiency.

2. A method according to claim 1, characterized in that said nitrides are of the form $Al_xGa_{1-x-y}In_yN$, wherein $0 \leq x \leq 1$ and $0 \leq y \leq 1$.

3. A method according to claim 1, characterized in that said bottom and top cladding layers are of the same material.

4. A method according to claim 3, characterized in that diffusion layers (6,7) are grown having lattice constants the same as that of the cladding layers (4,5).

5. A method according to claim 3, characterized in that diffusion layers (6,7) are grown, each of them having a lattice constant different from that of the cladding layers (4,5), a thickness smaller than the Matthews-Blakeslee critical thickness, and one of two adjacent diffusion layers (6,7) having a lattice constant greater and the other a lattice constant smaller than that of the cladding layers (4,5) in order to avoid strain accumulation in the diffusion layers.

6. A method according to claim 1, characterized in that a bottom cladding layer and diffusion layers are grown, each of them having an upper surface with facets having crystallographic indices other than (0001) and those of the type $\{1\bar{1}00\}$.

7. A method according to claim 6, characterized in that the growing of the bottom cladding layer comprises a step of formation of precipitates (14) on a (0001) oriented surface, said precipitates having a height of 0.1-1.5 μm and surface density of $10^7$-$10^8$ cm$^{-2}$.

8. A method according to claim 7, characterized in that said precipitates (14) are formed by a process consisting of a sequence of short low-temperature depositions, performed in temperature range of 450-700° C., followed by high-temperature layer annealing periods, performed in temperature range of 900-1150° C.

* * * * *